United States Patent
Iwata et al.

(10) Patent No.: US 9,589,855 B2
(45) Date of Patent: Mar. 7, 2017

(54) METHOD FOR MANUFACTURING X-RAY FLAT PANEL DETECTOR AND X-RAY FLAT PANEL DETECTOR TFT ARRAY SUBSTRATE

(71) Applicant: Toshiba Electron Tubes & Devices Co., Ltd., Otawara-shi (JP)

(72) Inventors: Hiroshi Iwata, Otawara (JP); Mitsushi Ikeda, Otawara (JP)

(73) Assignee: Toshiba Electron Tubes & Devices Co., Ltd., Otawara-shi (JP)

( * ) Notice: Subject to any disclaimer, the term of this patent is extended or adjusted under 35 U.S.C. 154(b) by 191 days.

(21) Appl. No.: 14/517,182

(22) Filed: Oct. 17, 2014

(65) Prior Publication Data

US 2015/0028338 A1 Jan. 29, 2015

Related U.S. Application Data

(63) Continuation of application No. PCT/JP2013/002486, filed on Apr. 11, 2013.

(30) Foreign Application Priority Data

Apr. 17, 2012 (JP) .................................. 2012-093989

(51) Int. Cl.
  *H01L 21/66* (2006.01)
  *H01L 27/146* (2006.01)
  *H01L 27/02* (2006.01)

(52) U.S. Cl.
  CPC .......... *H01L 22/14* (2013.01); *H01L 27/0248* (2013.01); *H01L 27/14632* (2013.01);
  (Continued)

(58) Field of Classification Search
  CPC .............. H01L 22/14; H01L 27/14687; H01L 27/14683; H01L 27/0248; H01L 27/14663; H01L 27/14632; H01L 27/14676
  See application file for complete search history.

(56) References Cited

U.S. PATENT DOCUMENTS

2003/0063706 A1* 4/2003 Ikeda ................ H01L 27/14659
  378/98.8

FOREIGN PATENT DOCUMENTS

JP 2004-303925 A 10/2004
JP 2007-155564 A 6/2007
(Continued)

OTHER PUBLICATIONS

International Search Report mailed Jul. 2, 2013 for PCT/JP2013/002486 filed on Apr. 11, 2013 with English Translation.
(Continued)

*Primary Examiner* — Kyoung Lee
(74) *Attorney, Agent, or Firm* — Oblon, McClelland, Maier & Neustadt, L.L.P.

(57) ABSTRACT

A common interconnect ring is provided at a periphery of a portion used to form a TFT array of an X-ray flat panel detector, and an X-ray flat panel detector TFT array substrate connected to signal lines and scanning lines via pairs of two protection diodes connected in parallel and having mutually-reverse polarities is manufactured. When inspecting the X-ray flat panel detector TFT array substrate, the same reference bias voltage as the amplifier of a detection circuit is applied from an external voltage application pad provided at the vicinity of a connection unit for the common interconnect ring and the protection diodes on the same side of the signal lines, a signal is provided to a scanning line connection pad to switch the thin film transistor ON, and an
(Continued)

electrical signal flowing through the signal line is read from a signal line connection pad.

12 Claims, 5 Drawing Sheets

(52) U.S. Cl.
 CPC .. *H01L 27/14663* (2013.01); *H01L 27/14683* (2013.01); *H01L 27/14687* (2013.01); *H01L 27/14676* (2013.01)

(56) References Cited

FOREIGN PATENT DOCUMENTS

| | | |
|---|---|---|
| JP | 2008-305959 A | 12/2008 |
| JP | 2009-170768 A | 7/2009 |
| JP | 2009-290171 A | 12/2009 |
| JP | 2010-43887 A | 2/2010 |

OTHER PUBLICATIONS

International Written Opinion mailed Jul. 2, 2013 for PCT/JP2013/002486 filed on Apr. 11, 2013.
Office Action issued on Feb. 5, 2016 in Korean Patent Application No. 10-2014-7031238 with English translation.

\* cited by examiner

METHOD FOR MANUFACTURING X-RAY FLAT PANEL DETECTOR AND X-RAY FLAT PANEL DETECTOR TFT ARRAY SUBSTRATE

CROSS-REFERENCE TO RELATED APPLICATIONS

This is a continuation application of International Application PCT/JP2013/002486, filed on Apr. 11, 2013; the entire contents of which are incorporated herein by reference.

FIELD

Embodiments of the invention relates to a method for manufacturing X-ray flat panel detector and an X-ray flat panel detector TFT array substrate.

BACKGROUND

In recent years in the field of medicine, it is commonplace for a patient to utilize multiple medical institutions. In such a case, there is a possibility that accurate treatment cannot be performed without the data of other medical institutions. Therefore, progress is being made toward making databases of patient medical data to perform treatment quickly and accurately.

It is desirable to make databases also for the image data of X-ray imaging. Accordingly, it is desirable to digitize X-ray imaging images. In medical X-ray diagnostic devices, conventionally, imaging has been performed using silver halide film. To digitize the image data imaged on silver halide film, it is necessary to re-scan the imaged film by a scanner, etc., after developing the film which requires time and effort.

Recently, a method has been realized in which the image is digitized directly using a CCD camera of about one inch. However, for example, when the lungs are imaged, a region of about 40 cm by 40 cm is imaged; and therefore an optical device that condenses the light is necessary; and the device undesirably becomes large.

As a method that solves the problems of these two methods, an indirect conversion X-ray flat panel detector that uses an amorphous silicon thin film transistor (a-Si TFT) has been proposed. This X-ray flat panel detector is an indirect conversion X-ray flat panel detector in which the incident X-rays are converted to visible light rays by a scintillator, etc., and the converted light is changed to charge by the photoelectric conversion film of each pixel.

In the X-ray flat panel detector, the pixels are arranged in an array configuration having lengthwise and crosswise sides of several hundred to several thousand pixels each. Each pixel includes a switching TFT made of a-Si, a photoelectric conversion film and a capacitor. The pixels arranged in the array configuration also are called a TFT array.

CITATION LIST

Patent Literature

[PTL 1]
JP 2009-290171A

DESCRIPTION OF EMBODIMENTS

Electrostatic protection diodes are formed in the TFT array used in the X-ray flat panel detector to prevent the degradation and breakdown due to static electricity or static electric charge generated in the array construction process. On the other hand, because various defects of the pixels and the interconnects exist in the TFT array, an inspection is implemented to detect the defects and remove defective arrays. It is necessary to remove the defective arrays because in the case where a defective array is fed into the next process, loss occurs for the process and the components used in the next process. However, the protection diodes themselves have leakage current and therefore reduce the precision of the inspection; and there is a possibility that defective parts may be undesirably passed on.

Therefore, the embodiment has an object of improving the inspection accuracy of the TFT array partway through the manufacturing of the X-ray flat panel detector.

Means for Solving the Problem

In order to achieve the object, according to an embodiment of the invention, a method for manufacturing an X-ray flat panel detector includes: a panel manufacturing process of manufacturing an X-ray flat panel detector TFT array substrate including an insulating substrate, a plurality of pixels, scanning lines, signal lines, a scanning line connection pad, a signal line connection pad, a common interconnect ring, protection diodes, and an external voltage application pad, the plurality of pixels being two-dimensionally arranged at a surface of the insulating substrate, the plurality of pixels including a thin film transistor and a photoelectric conversion film, the scanning line being provided for each row of the plurality of pixels, the signal line being provided for each column of the plurality of pixels, the scanning line connection pad being provided at an end portion of the scanning line, the signal line connection pad being provided at an end portion of the signal line, the common interconnect ring being provided around the plurality of pixels, the protection diodes being provided between the common interconnect ring and the scanning lines and between the common interconnect ring and the signal lines, the external voltage application pad being connected between a connection unit for the common interconnect ring and the protection diodes on the same side of the signal lines and a connection unit for the common interconnect ring and the protection diodes on the same side of the scanning lines; and an inspection process of inspecting the X-ray flat panel detector TFT array substrate by applying a reference bias voltage to the external voltage application pad, providing a signal to the scanning line connection pad to switch the thin film transistor ON, and reading, from the signal line connection pad, an electrical signal flowing through the signal line.

According to an embodiment of the invention, an X-ray flat panel detector TFT array substrate, includes: an insulating substrate; a plurality of pixels two-dimensionally arranged at a surface of the insulating substrate, the plurality of pixels including a thin film transistor and a photoelectric conversion film; a scanning line provided for each row of the plurality of pixels; a signal line provided for each column of the plurality of pixels; a scanning line connection pad provided at an end portion of the scanning line; a signal line connection pad provided at an end portion of the signal line; a common interconnect ring provided around the plurality of pixels; protection diodes provided between the common interconnect ring and the scanning lines and between the common interconnect ring and the signal lines; and an external voltage application pad connected between a connection unit for the common interconnect ring and the protection diodes on the same side of the signal lines and a connection unit for the common interconnect ring and the protection diodes on the same side of the scanning lines.

An X-ray flat panel detector TFT array according to several embodiments will now be described with reference to the drawings. The same or similar configurations are marked with the same reference numerals; and duplicate descriptions are omitted.

First Embodiment

Figure 1:
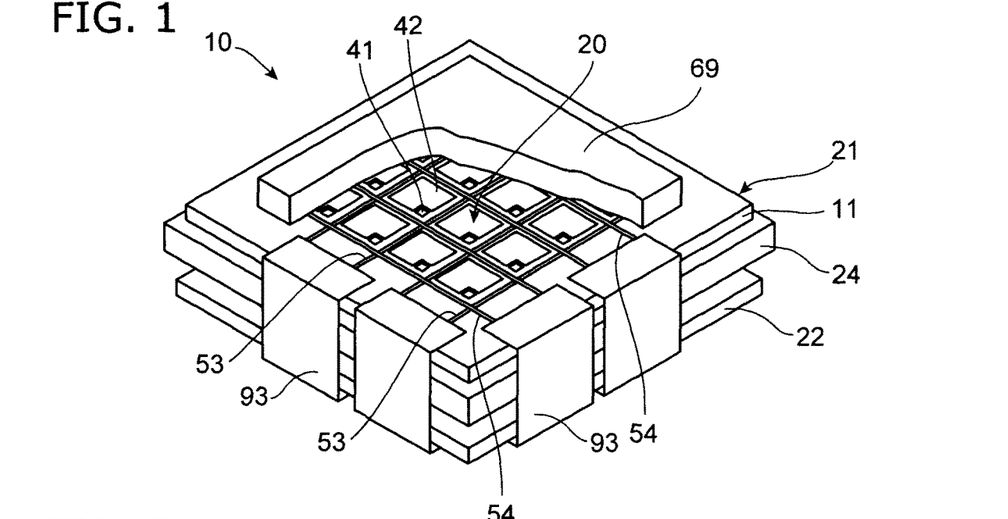
FIG. 1 is a schematic perspective view of an X-ray flat panel detector according to a first embodiment.
Figure 2:
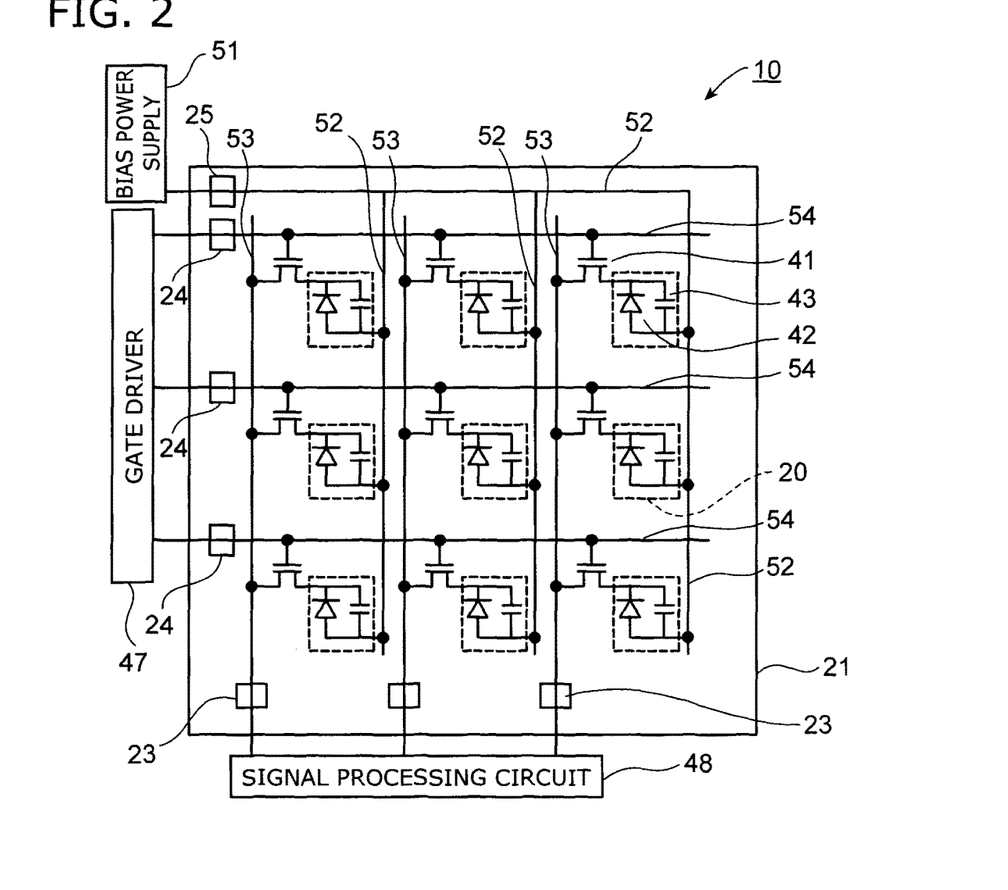
FIG. 2 is a circuit diagram of the X-ray flat panel detector according to the first embodiment.
Figure 3:
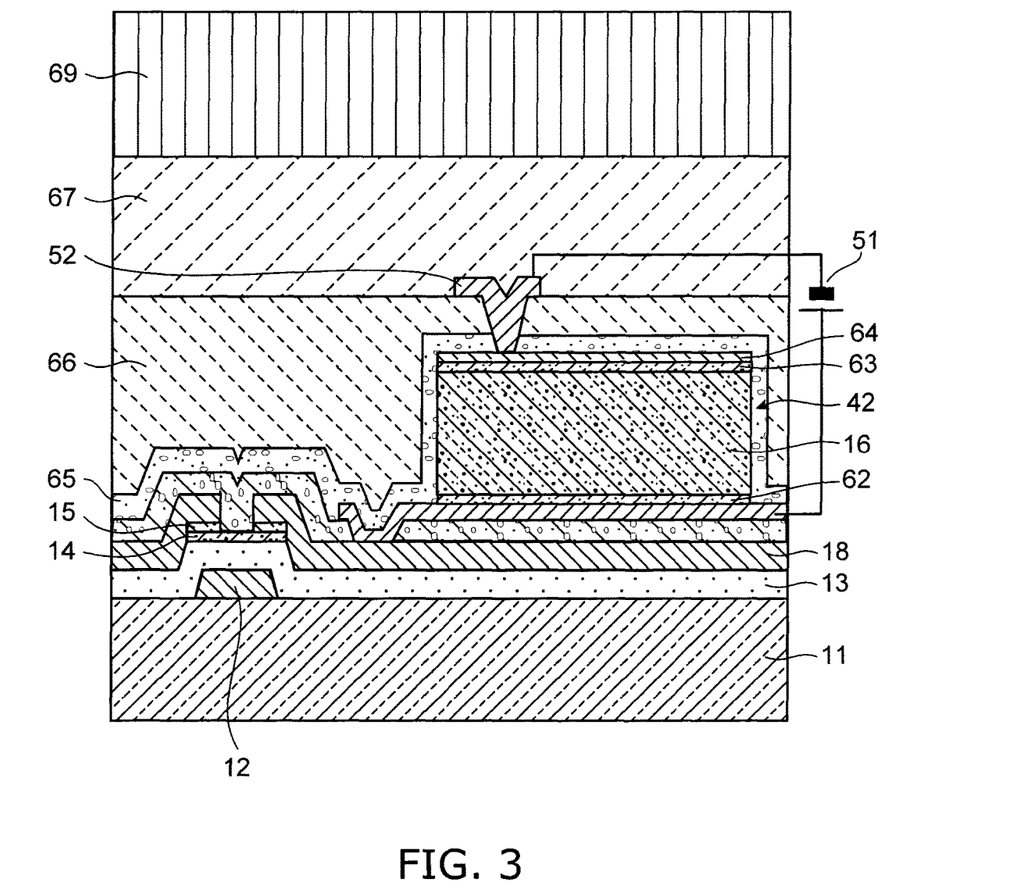
FIG. 3 is a partially enlarged cross-sectional view of the TFT array according to the first embodiment.
Figure 4:
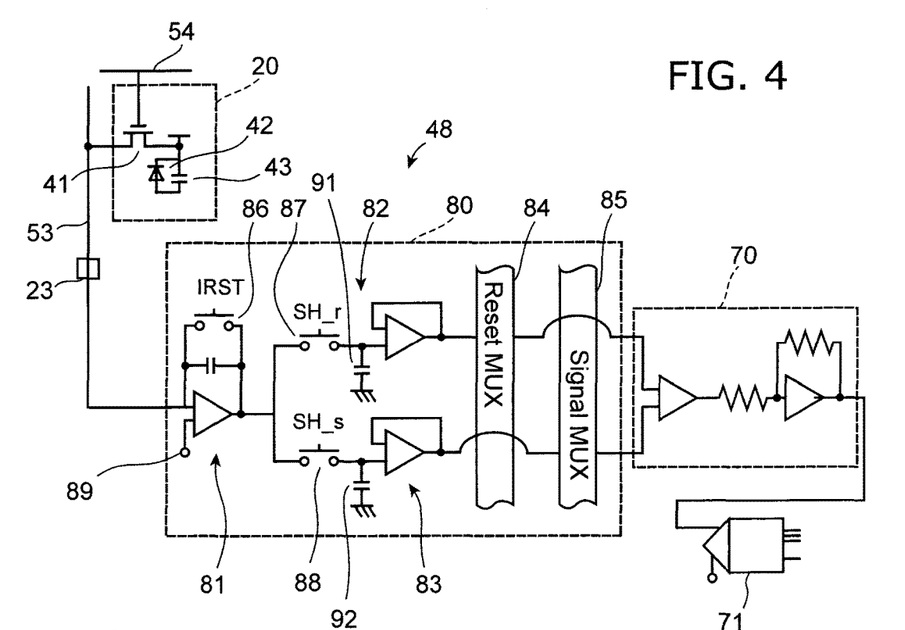
FIG. 4 is a circuit diagram of an amplifier circuit of the X-ray flat panel detector according to the first embodiment.

FIG. 1 is a schematic perspective view of an X-ray flat panel detector according to the first embodiment. FIG. 2 is a circuit diagram of the X-ray flat panel detector according to the embodiment. FIG. 3 is a partially enlarged cross-sectional view of the TFT array according to the embodiment. FIG. 4 is a circuit diagram of an amplifier circuit of the X-ray flat panel detector according to the embodiment.

The X-ray flat panel detector 10 includes multiple pixels 20 that are two-dimensionally arranged. The pixels 20 are arranged in an array configuration having lengthwise and crosswise sides of several hundred to several thousand pixels 20 each. The pixels 20 arranged in the array configuration on a glass substrate 11 are called a TFT array 21. Each of the pixels 20 includes a thin film transistor (TFT: thin film transistor) 41 which is a switching element, a photoelectric conversion film (PD: Photo Diode) 42, and a capacitor 43. The capacitance of the photoelectric conversion film and the stray capacitances of other elements and/or interconnects may be used instead of providing the capacitor 43.

A negative bias voltage is applied to the photoelectric conversion film 42 from a bias power supply 51 via a bias line 52. The thin film transistor 41 is connected to a signal line 53 and a scanning line 54. A gate driver 47 controls the ON/OFF of the thin film transistor 41 via the scanning line 54. A terminal of the signal line 53 is connected to a signal processing circuit 48.

The surface of the TFT array 21 is covered with a protection insulating film 67. Openings are made in portions of the protection insulating film 67; and connection pads 23, 24, 25, etc., that are provided at end portions of the bias line 52, the signal line 53, and the scanning line 54 are exposed. A layer of a scintillator film 69 is formed on the surface of the protection insulating film 67. The surface of the scintillator film 69 is covered with a reflective film (not shown) of Al or $TiO_2$. Also, the scintillator film 69 and the reflective film are covered with a protective layer (not shown).

For example, the bias power supply 51, the gate driver 47, and the signal amplifier circuit 48 are provided on a circuit substrate 22. The circuit substrate 22 is disposed on the backside of the TFT array 21. For example, a shielding plate 26 that shields X-rays and is made of lead is disposed between the TFT array 21 and the circuit substrate 22. The signal line 53, the scanning line 54, and the bias line 52 that are on the TFT array 21 are electrically coupled to the signal processing circuit 48, the gate driver 47, and the bias power supply 51 by a flexible substrate 93 connected to the connection pads 23, 24, and 25 provided respectively on the signal line 53, the scanning line 54, and the bias line 52.

The signal processing circuit 48 includes a read-out IC 80, a subtractor circuit 70, and an AD conversion circuit 71. The read-out IC 80 includes an integrating amplifier 81, a reset sampling unit 82, a signal sampling unit 83, a reset multiplexer 84, and a signal multiplexer 85.

The integrating amplifier 81 is connected to the signal line 53. A reference bias voltage is applied to an input terminal 89 of the integrating amplifier 81 that is not connected to the signal line 53. A reset switch 86 is provided in the integrating amplifier 81. The integrating amplifier 81 integrates and outputs the charge flowing through the signal line 53 when the reset switch 86 is in the open state.

The reset sampling unit 82 and the signal sampling unit 83 are connected in parallel and are connected to the output of the integrating amplifier 81. A reset sampling switch 87, a signal sampling switch 88, a reset sampling capacitor 91, and a signal sampling capacitor 92 are provided respectively in the reset sampling unit 82 and the signal sampling unit 83.

The reset multiplexer 84 is provided between the reset sampling unit 82 and one input of the subtractor circuit 70. The signal multiplexer 85 is provided between the signal sampling unit 83 and the other input of the subtractor circuit 70.

Although only one of each of the integrating amplifier 81, the reset sampling unit 82, and the signal sampling unit 83 is described in FIG. 4, these are provided for all of the signal lines 53. Although the reset multiplexer 84 and the signal multiplexer 85 are connected to one reset sampling unit 82 and one signal sampling unit 83 each, actually, the reset multiplexer 84 and the signal multiplexer 85 are connected to the reset sampling units 82 and the signal sampling units 83 provided for the multiple signal lines 53.

When X-rays are incident on the scintillator film 69, the phospor inside the scintillator film 69 onto which the X-rays are irradiated emit fluorescence. The fluorescence enters the photoelectric conversion film 42. In the photoelectric conversion film 42, the fluorescence is converted into charge. Because a voltage is applied to the photoelectric conversion film 42, the converted charge is attracted to the pixel electrode of each pixel 20 and is stored in the capacitor 43 via the pixel electrode.

Although an indirect conversion X-ray flat panel detector that uses a fluorescent film is described in the embodiment, similar effects are obtained even for a direct conversion X-ray flat panel detector. In the direct conversion X-ray flat panel detector, the fluorescent film and the reflective film are not used; and the X-rays are converted directly into charge by the photoelectric conversion film 42 which is a photodiode. The order of the n-layer and the p-layer in such a case is reversed in the case where the applied bias is positive.

When one column of thin film transistors 41 for switching connected to one scanning line 54 is switched ON and the scanning line 54 is driven by the gate driver 47, the stored charge is transferred to the signal processing circuit 48 via the signal line 53. The charge is input to the signal processing circuit 48 one pixel 20 at a time using the thin film transistor 41; and the charge signal is converted into a point sequential signal that can be displayed on a display such as a CRT, etc.

When reading the pixel value from the pixel 20 connected to some scanning line 54, first, the reset switch 86 of the integrating amplifier 81 is changed from the closed state to the open state. Thereby, the integrating amplifier 81 is switched from the state of being reset to the state in which the reset switch 86 is open and integration is possible. At this time, the gate signal that is provided to the scanning line 54 is OFF, that is, the thin film transistor 41 of each of the pixels 20 is in the open state and the pixel value of each of the pixels 20 is still retained in the capacitor 43.

Then, the reset signal is sampled by closing the reset sampling switch 87 of the reset sampling unit 82 and opening the reset sampling switch 87 after a prescribed amount of time has elapsed. Thereby, the signal of the reset state is sampled and held in the reset sampling capacitor 91.

After the reset sampling is thus completed, an ON signal is provided to one scanning line 54. Thereby, the thin film transistor 41 that is connected to the scanning line 54 is switched to the closed state; and the charge that is retained in the capacitor 43 is integrated by the integrating amplifier 81. After sufficient time for the sampling of the pixel value has elapsed, the gate signal is switched OFF. Thereby, charge corresponding to the pixel value is stored in the capacitor of the integrating amplifier 81.

After the integration of the charge stored in the capacitor 42 of the pixel 20 has ended, the signal sampling switch 88 of the signal sampling unit 83 is closed and then opened after a prescribed amount of time has elapsed. Thereby, a voltage corresponding to the pixel value is sampled and held in the signal sampling capacitor 92 of the signal sampling unit 83.

Thus, the integrals of the reset signal and the pixel value signal are sampled in the reset sampling unit 82 and the signal sampling unit 83 connected to each of the signal lines 53. The reset signal and the pixel value signal that are sampled in the reset sampling unit 82 and the signal sampling unit 83 connected to each of the signal lines 53 are sequentially transmitted to the subtractor circuit 70 by the reset multiplexer 84 and the signal multiplexer 85. The subtractor circuit 70 calculates the difference between the reset signal and the pixel value signal. The calculation result of the analog operation by the subtractor circuit 70 is transmitted to the AD conversion circuit 71 and converted into a digital value. The calculation result that is converted into the digital value is transmitted to an external device and displayed, for example, on a screen.

The amount of charge that is generated is different due to the amount of the light that is incident on the pixel 20; and the output amplitude of the amplifier circuit changes. Then, a digital image can be made directly by converting the output signal of the amplifier circuit to a digital signal by A/D conversion. A device that is thin and has a large screen can be made because the pixel region where the pixels 20 are arranged is the TFT array 21.

Figure 5:
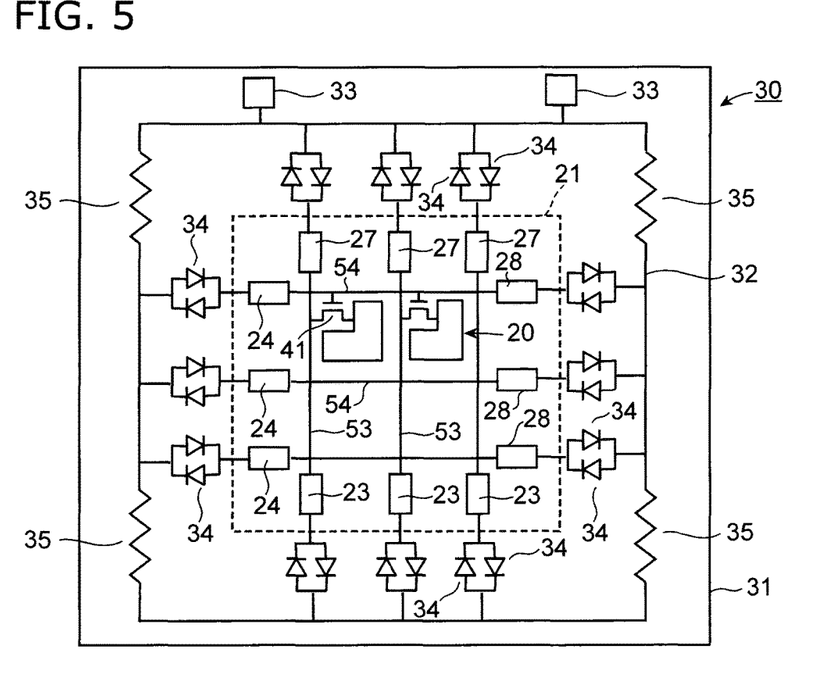
FIG. 5 is a schematic circuit diagram of the X-ray flat panel detector TFT array substrate according to the first embodiment.

FIG. 5 is a schematic circuit diagram of the X-ray flat panel detector TFT array substrate according to the embodiment.

A method for manufacturing the X-ray flat panel detector will now be described using FIG. 1 to FIG. 5. When manufacturing the X-ray flat panel detector, first, an X-ray flat panel detector TFT array substrate 30 is made.

The X-ray flat panel detector TFT array substrate 30 includes a glass plate 31 that is larger than the glass substrate 11 of the TFT array 21 (referring to FIG. 1). The interconnects of the signal line 53, the scanning line 54, etc., and the elements of the thin film transistor 41, the photoelectric conversion film 42, the capacitor 43, etc., that are included in the TFT array 21 are formed on the glass plate 31. Also, a pad 27 is provided at the end portion of the signal line 53 on the side opposite to the connection pad 23 (the signal line connection pad) connected to the signal processing circuit 48. Also, a pad 28 is provided at the end portion of the scanning line 54 on the side opposite to the connection pad 24 (the scanning line connection pad) connected to the gate driver 47.

Protection diodes 34 for electrostatic protection are provided on the glass plate 31 at the outer circumference of the portion used to form the TFT array 21. Two protection diodes 34 that are connected in parallel so that the polarities are reverse to each other form a pair; and the pair of protection diodes 34 is provided on two sides of the signal line 53 and two sides of the scanning line 54. The sides of the diodes 34 opposite to the signal line 53 and the scanning line 54 are connected to a common interconnect ring 32. The common interconnect ring 32 is provided around the outer circumference of the protection diodes 34 and the portion used to form the TFT array 21. As long as the protection diodes have diode characteristics, the protection diode may be a normal p-n or p-i-n diode or a TFT having a diode-like connection. The circuit of the protection diodes may have a circuit configuration in which the protection effect is strengthened by further combining a pair of reverse connection diodes.

External voltage application pads 33 are provided at the common interconnect ring 32. The external voltage application pads 33 are provided at two locations at the vicinity of the protection diodes 34 connected to the signal line 53 on the side opposite to the side connected to the signal processing circuit 48 on two sides of the connection unit for the common interconnect ring 32 and the protection diodes 34. That is, the external power supply application pads 33 are connected between the connection unit for the common interconnect ring 32 and the protection diodes 34 on the same side of the signal lines 53, i.e., the upper side in FIG. 5, and the connection unit for the common interconnect ring 32 and the protection diodes 34 on the same side of the scanning lines 54, i.e., one of the left side or the right side in FIG. 5. Interconnect resistance 35 exists in the common interconnect ring 32.

When manufacturing the X-ray flat panel detector TFT array substrate 30, first, a pattern that is used to form a gate electrode 12 of the thin film transistor 41 is formed by depositing a metal on the glass plate 31 and removing a portion of the metal by etching. Then, SiNx is deposited as an insulating film 13 by plasma CVD.

Further, an undoped a-Si 1 layer 14 and an amorphous silicon ($n^+$ a-Si) layer 15 into which an n-type impurity is introduced are deposited on the surface of the insulating film 13. Then, an island of a-Si is formed by etching the $n^+$ a-Si layer 15 and the undoped a-Si layer 14 that are stacked.

Then, contact holes are made by etching the insulating film 13 in regions corresponding to contacts inside and outside the pixel area. An auxiliary electrode 18, a signal line 45, and other interconnects are formed on these films by stacking Mo of about 50 nm, Al of about 350 nm, and further Mo of about 20 nm to about 50 nm by sputtering.

Then, a protective film 17 is further formed by depositing SiNx. Subsequently, a photodiode (PD) is formed by sequentially depositing a pixel electrode, an n+ a-Si layer 62, an a-Si layer 16, and an amorphous silicon (p+ a-Si) layer 63 into which a p-type impurity is introduced and by forming an ITO layer 64 on the surface. The photodiode is used to form the photoelectric conversion film 42.

Further, protective films 65 and 66 are sequentially formed of SiN on the surface of these films; and contact holes to the photoelectric conversion film 42 are made. The bias line 52 of Al is formed on these films in contact with the ITO layer 64 which is the upper electrode of the photoelectric conversion film 42.

Then, the protection insulating film 67 is formed on the surface of these films; and holes are made for contacts in the portions of the connection pads 23, 24, and 25, the other pads 27 and 28, and the external voltage application pads 33.

The common interconnect ring 32 is formed by patterning the metal in the same process as the formation of the gate electrode 12. Also, the protection diode 34 is formed by stacking the semiconductor in the same process as the manufacturing of the thin film transistor 41. Thus, by manufacturing the common interconnect ring 32 and the protection diode 34 at an early stage of the manufacturing of the X-ray detector TFT array substrate 30, the effects of static electricity in the subsequent processes can be reduced.

After manufacturing such an X-ray flat panel detector TFT array substrate 30, an inspection of the portion used to form the TFT array 21 is performed. In the inspection, a reference bias voltage is applied to the external voltage application pad 33 by a probe or other means.

Also, a prescribed reference bias voltage is applied to the pad 27 on the side opposite to the connection pad 23 connected to the signal processing circuit 48. The reference bias voltage is the bias voltage applied to the input terminal 89 of the integrating amplifier 81 of the signal processing circuit 48 that is not connected to the signal line 53. The reference bias voltage is, for example, 1.5 V. A signal read-out circuit (not shown) that is equivalent to the signal processing circuit 48 is connected by a probe or other means to the connection pad 23 connected to the signal processing circuit 48.

In this state, a prescribed voltage is applied between the connection pad 24 and the pad 28 on the two ends of the scanning line 54. For the prescribed voltage, it is sufficient to select a voltage that is equal to or near the drive voltage of the X-ray flat panel detector 10 so that the leakage current of the reverse bias of the thin film transistor 41 is sufficiently small; and −9 V, for example, is applied. Thereby, the charge signal from the capacitor 43 on the TFT array 21 is transmitted to the signal read-out circuit via the connection pad 23. The soundness of the elements such as the thin film transistor 41, etc., on the TFT array 21 is confirmed using the charge signal.

If a voltage is not applied to the common interconnect ring 32 when inspecting the TFT array 21, a leakage current flows in the protection diode 34 for electrostatic protection disposed at the outer circumference of the TFT array 21. The leakage current changes the detection signal value transmitted to the signal read-out circuit; and the inspection accuracy degrades. In particular, the degradation is pronounced in the X-ray flat panel detector which handles very faint charge signals.

The leakage current of the protection diode 34 can be reduced by reducing the voltage applied to the protection diode 34. In the embodiment, substantially the same voltage is applied to the two ends of the protection diode 34 because the reference bias voltage is applied to the common interconnect ring 32. That is, the voltage that is applied to the protection diode 34 is substantially zero. Thereby, the current that flows through the protection diode 34 is substantially zero or an extremely small value. Accordingly, the inspection accuracy in the inspection process of the X-ray flat panel detector can be improved.

Thus, after the soundness of the TFT array 21 is confirmed, the glass plate 31, the interconnects, etc., are cut between the protection diodes 34 and the connection pad 23 and the pad 27 provided on the two ends of the signal line 53 and between the connection pad 24 and the pad 28 provided on the two sides of the scanning lines 54. Thus, the TFT array 21 is cut out of the glass plate 31.

The scintillator film 69 is formed on the surface of the TFT array 21 thus formed by forming a fluorescent film of CsI; Tl or by stacking a powder sheet of GOS. Further, a reflective film is formed of Al or $TiO_2$ on the surface of the scintillator film 69; and a protective layer is formed on the uppermost portion. After forming the protective layer, the X-ray flat panel detector 10 is completed by being connected to the circuit substrate 22, etc., and contained in a housing (not shown). The scintillator film 69 is not limited to the example described above; and other fluorescent substances may be used.

Thus, according to the embodiment, the inspection accuracy of the inspection process of the X-ray flat panel detector can be improved. As a result, the likelihood of a defective TFT array 21 proceeding to the next process can be reduced.

Second Embodiment

Figure 6:
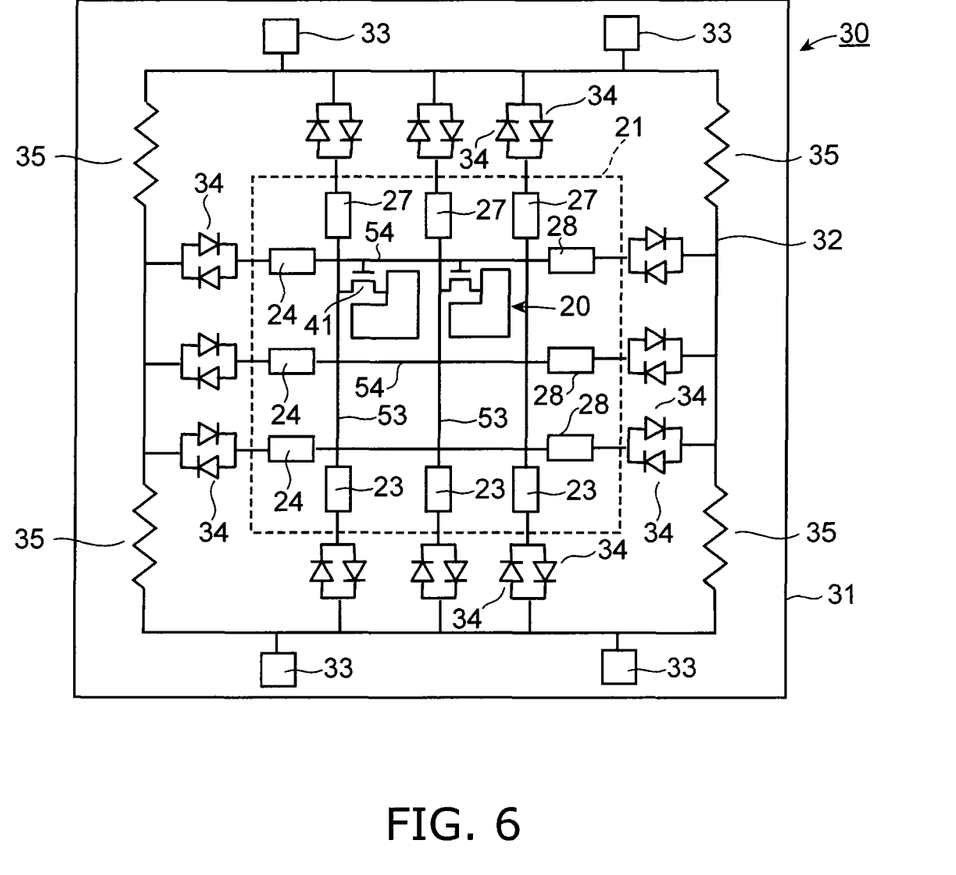
FIG. 6 is a schematic circuit diagram of the X-ray flat panel detector TFT array substrate according to a second embodiment.

FIG. 6 is a schematic circuit diagram of the X-ray flat panel detector TFT array substrate according to a second embodiment.

In the X-ray flat panel detector TFT array substrate 30 the embodiment, the external voltage application pads 33 are added to the X-ray flat panel detector TFT array substrate 30 of the first embodiment (referring to FIG. 5). In the embodiment, the external voltage application pads 33 are provided not only at the two locations at the positions on two sides of the connection unit for the common interconnect ring 32 and the protection diodes 34 provided on the one pad 27 side of the signal lines 53 but also at two locations on two sides of the connection unit for the common interconnect ring 32 and the protection diodes 34 provided on the connection pad 23 side which is used as the connection unit for the signal lines 53 and the signal processing circuit 48 (referring to FIG. 1).

The TFT array is not limited to the example described above; and other TFT array structure, such as signal line pads and protection diodes are formed in only one side as in FIG. 2, may be used.

In the inspection, the prescribed reference bias voltage is applied to each of the external voltage application pads 33. In the case where the prescribed reference bias voltage is applied to one of the connection unit for the common interconnect ring 32 and the protection diodes 34 provided on the one pad 27 side of the signal lines 53 or the connection unit for the common interconnect ring 32 and the protection diodes 34 provided on the connection pad 23 side which is used as the connection unit for the signal lines 53 and the signal processing circuit 48 (referring to FIG. 1), there are cases where the potential of the common interconnect ring 32 is undesirably different between the two sides of these signal lines 53 due to the existence of the interconnect resistance 35 of the common interconnect ring 32.

However, in the embodiment, the potential of the common interconnect ring 32 on the two sides of the signal lines 53 can be substantially constant because the prescribed reference bias voltage is applied to the common interconnect ring 32 on the two sides of the signal lines 53. As a result, the leakage current that flows through the protection diode 34 can be reduced further. Accordingly, the inspection accuracy of the inspection process of the X-ray flat panel detector can be improved.

Also, the voltage that is applied to the connection pad 23 and the pad 27 of the end portions of the signal line 53 is different from the voltage that is applied to the connection pad 24 and the pad 28 of the end portions of the scanning line 54. Therefore, the voltage that is applied to the amplifier of the signal processor is affected.

Here, the common interconnect ring 32 may be set to have a low resistance at the portions connected to the groups of protection diodes 34 provided on the two sides of the signal lines 53 and the portions connected to the groups of protection diodes 34 provided on the two sides of the scanning lines 54; and the common interconnect ring 32 may be set to have a high resistance at the connection portion to the protection diodes 34 on the signal line 53 side and the connection portion to the protection diodes 34 on the scanning line 54 side. That is, the common interconnect ring 32 interconnect resistance inside the groups of the connection pad 23 and the pad 27 provided on the same side of the signal lines 53 and inside the groups of the connection pad 24 and the pad 28 provided on the same side of the scanning lines 54 is set to be small; and the interconnect resistance of the common interconnect ring 32 at the connection portions between the groups is set to be high.

This can be realized by setting the interconnect resistance per unit length to be higher between the pad groups than within the pad groups. For example, it is sufficient to form the low resistance interconnect of a low-resistance metal such as Al, etc., and form the high resistance interconnect of a transparent electrode such as ITO, etc.

Third Embodiment

Figure 7:
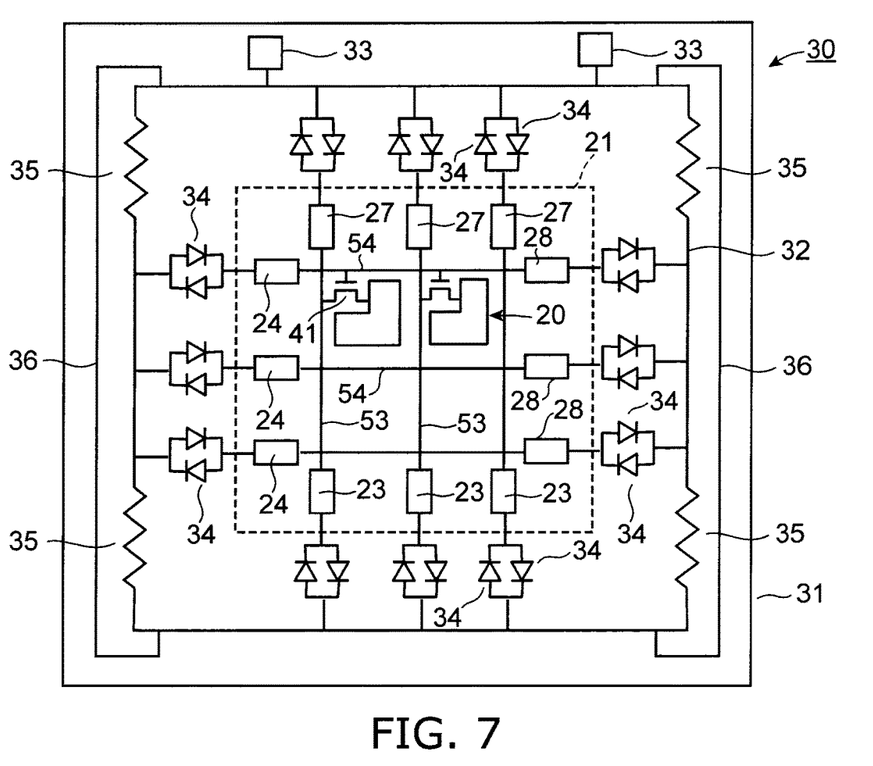
FIG. 7 is a schematic circuit diagram of the X-ray flat panel detector TFT array substrate according to a third embodiment.

FIG. 7 is a schematic circuit diagram of the X-ray flat panel detector TFT array substrate according to a third embodiment.

In the X-ray flat panel detector TFT array substrate 30 of the embodiment, a connection interconnect 36 is added to the X-ray flat panel detector TFT array substrate 30 of the first embodiment (referring to FIG. 5). The connection interconnect 36 is connected to the common interconnect ring 32 at the vicinity of the connection unit for the external voltage application pads 33 and is connected to the common interconnect ring 32 at the vicinity of the connection unit for the common interconnect ring 32 and the protection diodes 34 provided on the connection pad 23 side which is used as the connection unit for the signal lines 53 and the signal processing circuit 48 (referring to FIG. 1). The electrical resistance of the connection interconnect 36 is set to be smaller than the interconnect resistance 35 existing in the common interconnect ring 32 by using, for example, a metal, etc., having a small specific resistance. It is desirable for the potential drop of the connection interconnect 36 to be 1 V or less.

In the case where such an X-ray flat panel detector TFT array substrate 30 is used, when applying the prescribed reference bias voltage to the external voltage application pads 33 in the inspection, the potential of the connection unit for the common interconnect ring 32 and the protection diodes 34 provided on the connection pad 23 side which is used as the connection unit for the signal line 53 and the signal processor also becomes substantially the same as that of the external voltage application pads 33. As a result, the leakage current that flows through the protection diode 34 can be reduced further. Accordingly, the inspection accuracy of the inspection process of the X-ray flat panel detector can be improved.

Also, because the probe and circuit for applying the reference bias voltage in the inspection can be only those for one end portion side of the signal line 53, the cost of the inspection apparatus, etc., can be lower than that of the second embodiment.

Fourth Embodiment

Figure 8:
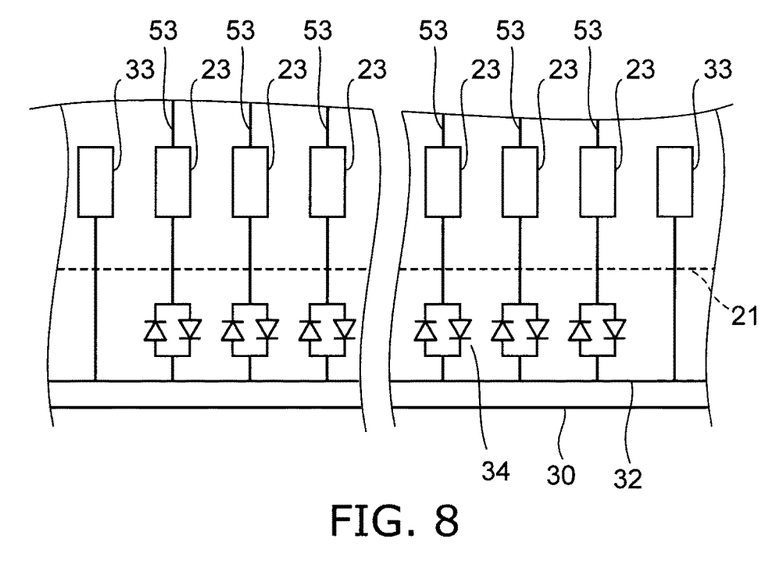
FIG. 8 is a schematic circuit diagram of the X-ray flat panel detector TFT array substrate according to a fourth embodiment.

FIG. 8 is a schematic circuit diagram of the X-ray flat panel detector TFT array substrate according to a fourth embodiment.

In the embodiment, the positions of the external voltage application pads 33 are different from those of the second embodiment. In the embodiment, the connection pads 23 that are provided on the signal line 53 are arranged in a straight line configuration. The external voltage application pads 33 are disposed to be arranged in the same straight line configuration as the connection pads 23 at two ends of the arrangement of the connection pads 23 provided on the signal lines 53. Accordingly, the external power supply application pads 33 remain inside the product after cutting out the TFT array 21.

Also, because a portion between the common interconnect ring 32 and the external voltage application pad 33 remains inside the TFT array 21 that is cut out, it is difficult to use an interconnect having a material different from that of the signal lines 53, etc. Therefore, the connection between the common interconnect ring 32 and the external voltage application pad 33 is via resistance. Therefore, although a slight voltage drop occurs, the inspection accuracy substantially is not affected because the magnitude of the voltage drop can be set to be lower than the threshold voltage of the diode 34.

Even in such an X-ray flat panel detector, the inspection accuracy of the inspection process of the X-ray flat panel detector can be improved. As a result, the likelihood of a defective TFT array 21 proceeding to the next process can be reduced.

Also, the probes for the inspection can be easily brought into contact by arranging the external voltage application pads 33 in the same straight line configuration as the connection pads 23 provided on the signal lines 53. As a result, the inspection becomes easy.

Often, there are cases where the connection pads 23 are formed in groups by the number of data processing bits of the IC processing the signals. A gap of some distance is formed between mutually-adjacent groups. The external power supply application pads 33 may be provided on two sides of the arrangement of the connection pads 23 of such groups.

Further, an interconnect having open end portions may extend along the signal line 53 from the external voltage application pad 33. By providing such an interconnect, the likelihood of noise due to external effects being included in the signal transmitted from the pixel 20 via the signal line 53 is reduced.

Although several embodiments of the invention are described, these embodiments are presented as examples and are not intended to limit the scope of the invention. These novel embodiments may be implemented in other various forms; and various omissions, substitutions, and modifications can be performed without departing from the spirit of the invention. Such embodiments and their modifications are within the scope and spirit of the invention and are included in the invention described in the claims and their equivalents.

The invention claimed is:

1. A method for manufacturing an X-ray flat panel detector, comprising:
a panel manufacturing process of manufacturing an X-ray flat panel detector TFT array substrate including an insulating substrate, a plurality of pixels, scanning lines, signal lines, a scanning line connection pad, a signal line connection pad, a common interconnect ring, protection diodes, and an external voltage application pad, the plurality of pixels being two-dimensionally arranged at a surface of the insulating substrate, the plurality of pixels including a thin film transistor and a photoelectric conversion film, the scanning line being provided for each row of the plurality of pixels, the signal line being provided for each column of the plurality of pixels, the scanning line connection pad being provided at an end portion of the scanning line, the signal line connection pad being provided at an end portion of the signal line, the common interconnect ring being provided around the plurality of pixels, the protection diodes being provided between the common interconnect ring and the scanning lines and between the common interconnect ring and the signal lines, the external voltage application pad being connected between a connection unit for the common interconnect ring and the protection diodes on the same side of the signal lines and a connection unit for the common interconnect ring and the protection diodes on the same side of the scanning lines; and
an inspection process of inspecting the X-ray flat panel detector TFT array substrate by applying a reference bias voltage to the external voltage application pad, providing a signal to the scanning line connection pad to switch the thin film transistor ON, and reading, from the signal line connection pad, an electrical signal flowing through the signal line.

2. The method for manufacturing the X-ray flat panel detector according to claim 1, wherein the protection diodes are provided as a pair connected in parallel, the pair having mutually-reverse polarities.

3. The method for manufacturing the X-ray flat panel detector according to claim 1, wherein the reference bias voltage is the same as a bias voltage provided to an amplifier circuit for the electrical signal read in the inspection process.

4. The method for manufacturing the X-ray flat panel detector according to claim 1, wherein the external voltage application pads are provided on two sides of the connection unit for the common interconnect ring and the protection diodes on the same side of the signal lines.

5. The method for manufacturing the X-ray flat panel detector according to claim 1, wherein the external voltage application pads are provided at vicinities of the connection units for the common interconnect ring and the protection diodes on each of two sides of the signal lines.

6. The method for manufacturing the X-ray flat panel detector according to claim 5, wherein an electrical resistance between connection portions between the common interconnect ring and the protection diodes on the same side of the signal lines is smaller than an electrical resistance between a connection portion between the common interconnect ring and the protection diode connected to the signal line and a connection portion between the common interconnect ring and the protection diode connected to the scanning line.

7. The method for manufacturing the X-ray flat panel detector according to claim 5, further comprising a connection interconnect having an electrical resistance smaller than an electrical resistance of the common interconnect ring connecting a vicinity of the external voltage application pad to a vicinity of a connection unit on the opposite side of the signal lines, between the common interconnect ring and the protection diodes.

8. The method for manufacturing the X-ray flat panel detector according to claim 1, further comprising a scintillator film formation process of forming the scintillator film covering the pixels after the inspection process.

9. The method for manufacturing the X-ray flat panel detector according to claim 1, further comprising a panel cut process of cutting out the X-ray flat panel detector TFT array substrate by cutting the X-ray flat panel detector TFT array substrate between the common interconnect ring and the signal line connection pad and between the common interconnect ring and the scanning line connection pad.

10. The method for manufacturing the X-ray flat panel detector according to claim 9, further comprising:
a process of connecting a gate drive circuit to the scanning line connection pad after the panel cut process, the gate drive circuit driving the TFT; and
a process of connecting a signal read-out circuit to the signal line connection pad after the panel cut process, the signal read-out circuit reading a charge signal from a capacitor included in the pixel.

11. An X-ray flat panel detector TFT array substrate, comprising:
an insulating substrate;
a plurality of pixels two-dimensionally arranged at a surface of the insulating substrate, the plurality of pixels including a thin film transistor and a photoelectric conversion film;
a scanning line provided for each row of the plurality of pixels;
a signal line provided for each column of the plurality of pixels;
a scanning line connection pad provided at an end portion of the scanning line;
a signal line connection pad provided at an end portion of the signal line;
a common interconnect ring provided around the plurality of pixels;
protection diodes provided between the common interconnect ring and the scanning lines and between the common interconnect ring and the signal lines; and
an external voltage application pad connected between a connection unit for the common interconnect ring and the protection diodes on the same side of the signal lines and a connection unit for the common interconnect ring and the protection diodes on the same side of the scanning lines.

12. The X-ray flat panel detector TFT array substrate according to claim 11, further comprising a connection interconnect having an electrical resistance smaller than an electrical resistance of the common interconnect ring connecting a vicinity of the external voltage application pad to a vicinity of a connection unit on the opposite side of the signal lines, between the common interconnect ring and the protection diodes.

* * * * *